United States Patent
Fuchs

(10) Patent No.: US 8,084,524 B2
(45) Date of Patent: Dec. 27, 2011

(54) FLAME RETARDANT COMBINATIONS OF HYDROXYALKYL PHOSPHINE OXIDES WITH 1,3,5-TRIAZINES AND EPOXIDES

(75) Inventor: Sabine Fuchs, Mannheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/677,715

(22) PCT Filed: Sep. 5, 2008

(86) PCT No.: PCT/EP2008/061747
§ 371 (c)(1),
(2), (4) Date: Mar. 11, 2010

(87) PCT Pub. No.: WO2009/034023
PCT Pub. Date: Mar. 19, 2009

(65) Prior Publication Data
US 2010/0210763 A1    Aug. 19, 2010

(30) Foreign Application Priority Data
Sep. 13, 2007 (EP) .................................. 07116292

(51) Int. Cl.
*C08K 5/3492* (2006.01)

(52) U.S. Cl. .................... 524/100; 524/129; 524/139
(58) Field of Classification Search ............ 524/100, 524/129, 139
See application file for complete search history.

(56) References Cited

U.S. PATENT DOCUMENTS

| 4,345,059 | A | 8/1982 | Fretz, Jr. et al. |
| 2004/0025743 | A1* | 2/2004 | Wakizaka et al. ........... 106/18.11 |
| 2005/0049339 | A1 | 3/2005 | Knop et al. |
| 2007/0149635 | A1* | 6/2007 | Mutoh ............................. 522/6 |
| 2008/0171817 | A1* | 7/2008 | Peters et al. .................. 524/100 |

FOREIGN PATENT DOCUMENTS

DE     38 33 977     4/1990

* cited by examiner

*Primary Examiner* — Peter Szekely
(74) *Attorney, Agent, or Firm* — Oblon, Spivak, McClelland, Maier & Neustadt, L.L.P.

(57) ABSTRACT

The present invention relates to flame retardant polymer compositions which comprise combinations of hydroxyalkyl phosphine oxides with 1,3,5-triazine compounds and polyfunctional epoxide compounds. The compositions are in the form of epoxy laminates which are useful for the manufacture of prepregs, laminates for the preparation of printed circuit boards and printed wiring boards.

17 Claims, No Drawings

FLAME RETARDANT COMBINATIONS OF HYDROXYALKYL PHOSPHINE OXIDES WITH 1,3,5-TRIAZINES AND EPOXIDES

The invention relates to flame retardant compositions formed from a mixture of hydroxyalkyl phosphine oxides and a polyphosphate salt of a 1,3,5-triazine compound in the presence of a polyfunctional epoxide compound and a hardener compound. According to an alternative embodiment, the invention relates to flame retardant compositions which comprise a mixture of hydroxyalkyl phosphine oxides, a polyphosphate salt of a 1,3,5-triazine compound and a polyfunctional epoxide compound in a polymer substrate.

Flame retardants are added to polymeric materials (synthetic or natural) to enhance the flame retardant properties of the polymers. Depending on their composition, flame retardants may act in the solid, liquid or gas phase either chemically, e.g. as a spumescent by liberation of nitrogen, and/or physically, e.g. by producing a foam coverage. Flame retardants interfere during a particular stage of the combustion process, e.g. during heating, decomposition, ignition or flame spread.

There is still a need for flame retardant compositions with improved properties that can be used in different polymer substrates. A particular need is seen in suitable flame retardant compositions for the manufacture of glass-fiber reinforced epoxy prepregs, laminates, and printed circuit boards, as well as printed wiring boards derived thereof.

Increased standards with regard to safety and environmental requirements result in stricter regulations. Particularly known halogen containing flame retardants no longer match all necessary requirements. Therefore, halogen free flame retardants are preferred, particularly in view of their better performance in terms of smoke density associated with fire. Improved thermal stability and decreased delamination tendency are further benefits of halogen free flame retardant compositions.

WO 00/02869 discloses polyphosphate salts of a 1,3,5-triazine compound and its use for flame retardant compositions.

U.S. Pat. No. 5,084,546 discloses flame retardant epoxy resin compositions, wherein hydroxyalkyl phosphine oxides are present as active components.

It has surprisingly been found that polymers with excellent flame retardant properties are prepared in the event that combinations of hydroxyalkyl phosphine oxides with 1,3,5-triazine compounds and polyfunctional epoxide compound are added to the polymer substrate.

According to a preferred embodiment, epoxy laminates with excellent flame retardant properties are obtained by using a synergistic flame retardant combination of melamine polyphosphate and selected hydroxyalkyl phosphine oxide derivatives. Moreover, the quality of the laminates, such as the laminate surface smoothness or laminate integrity, is strongly increased and their delamination tendency significantly decreased as compared to laminates containing only one of the mentioned flame retardant components.

The invention relates to a composition, particularly a flame retardant composition, which comprises a) At least one hydroxyalkyl phosphine oxide of the formula $$\text{HO}-(\text{CH}_2)_m-\underset{\underset{R}{|}}{\overset{\overset{O}{\|}}{P}}-(\text{CH}_2)_n-\text{OH,} \quad (I)$$

Wherein m and n independently of one another represent numerals from 1 to 8; and R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;

b) At least one polyphosphate salt of a 1,3,5-triazine compound of the formula $$\left[\text{HO}-\underset{\underset{O^-}{|}}{\overset{\overset{O}{\|}}{P}}-O\right]_p H, \quad (II)$$

$$TH^+$$

Wherein T represents a 1,3,5-triazine compound; and
p represents a numeral greater than 3;

c) At least one polyfunctional epoxide compound; and
$d_1$) A hardener compound; or
$d_2$) A polymer substrate.

The compositions according to the invention attain the desirable V-0 rating, according to UL-94 (Underwriter's Laboratories Subject 94) and other excellent ratings in related test methods especially in glass fiber reinforced compositions where conventional flame retardants tend to fail.

The compositions according to the invention are characterized by their excellent thermal and mechanical characteristics. In the context of the description of the invention, mechanical stability is defined as the ability of a laminate to withstand delamination upon heating or mechanical stress. Thermal stability is defined as the degree of resistance against foaming upon heating. For a more precise differentiation in thermal stability of flame retardant compositions, physicochemical methods, such as thermo-gravimetric analysis (TGA) and differential scanning calorimetry (DSC), can be used.

The flame retardant epoxy resin compositions of the present invention are especially useful for the manufacture of prepregs, laminates for the preparation of printed circuit boards and printed wiring boards.

A preferred embodiment of the invention relates to a composition, which comprises a) At least one hydroxyalkyl phosphine oxide (I),
  Wherein m and n independently of one another represent numerals from 1 to 8; and
  R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;

b) At least one polyphosphate salt of a 1,3,5-triazine compound (II),
  Wherein T represents a 1,3,5-triazine compound; and
  p represents a numeral greater than 3;

c) At least one polyfunctional epoxide compound; and
$d_1$) A hardener compound.

A particularly preferred embodiment of the invention relates to a composition, which comprises a) 0.05-30.0 wt. % of the hydroxyalkyl phosphine oxide (I);
b) 0.10-40.0 wt % of the polyphosphate salt of a 1,3,5-triazine compound (II);
c) 60.0-95.0 wt % of a polyfunctional epoxide compound; and
$d_1$) 0.10-40.0 wt % of a hardener compound.

An alternative embodiment of the invention relates to a composition, which comprises
  a) At least one hydroxyalkyl phosphine oxide (I),
    Wherein m and n independently of one another represent numerals from 1 to 8; and
    R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;
  b) At least one polyphosphate salt of a 1,3,5-triazine compound (II),
    Wherein T represents a 1,3,5-triazine compound; and
    p represents a numeral greater than 3;
  c) At least one polyfunctional epoxide compound; and
  $d_2$) A polymer substrate.

The compositions, as defined above, comprise the following components:

Component a)

The indizes m and n represent in the hydroxyalkyl phosphine oxide (I) independently of one another numerals from 1 to 8.

According to a preferred embodiment, the indizes m and n represent independently of one another numerals from 1 to 4.

R defined as $C_1$-$C_8$alkyl is, e.g. methyl, ethyl or straight chained or branched $C_3$-$C_8$alkyl, e.g. n-propyl, isopropyl, n-, iso- or tert-butyl, n-pentyl, isoamyl, neopentyl, 2-ethylbutyl, n-hexyl, 1-methylpentyl, 1,3-dimethylbutyl, n-heptyl, iso-heptyl, n-octyl, 1,4,4-trimethyl2-pentyl, 3,4-, 3,5- or 4,5-dimethyl-1-hexyl, 3- or 5-methyl-1-heptyl, 1,1,3,3-tetramethylbutyl, 2-ethylhexyl or branched octyl as obtained from a dimer of isobutylene.

R defined as hydroxy-$C_1$-$C_8$alkyl is, e.g. hydroxymethyl, 2-hydroxyethyl, 2- or 3-n-hydroxypropyl or 2-hydroxyisobutyl (=2-methyl-2-hydroxypropyl).

R defined as phenyl substituted by 1 to 3 substituents selected from the group consisting of hydroxy, $C_1$-$C_4$alkyl and $C_1$-$C_4$alkoxy is, e.g. phenyl that is substituted, for example, by from one to three of the $C_1$-$C_4$alkyl radicals described above, phenyl that is substituted by hydroxy and from two to three of the $C_1$-$C_4$alkyl radicals, e.g. 3,5-di-tert-butyl-4-hydroxyphenyl or 3-tert-butyl-4-hydroxy-5-methylphenyl, or phenyl that is substituted, for example, by from one to three of the $C_1$-$C_4$alkoxy radicals, e.g. methoxy or ethoxy.

Particularly preferred is bis(hydroxyalkyl)alkylphosphine oxide (I), wherein R is $C_1$-$C_4$alkyl, or tris(hydroxyalkyl) phosphine oxide (I), such as isobutyl-bis(hydroxymethyl) phosphine oxide, tert-butyl-bis(hydroxymethyl)phosphine oxide, methyl-bis(hydroxymethyl)phosphine oxide, tris(hydroxymethyl)phosphine oxide, isobutyl-bis(2-hydroxyethyl) phosphine oxide, tert-butyl-bis(2-hydroxyethyl)phosphine oxide, methyl-bis(2-hydroxyethyl)phosphine oxide, isobutyl-bis(3-hydroxypropyl)phosphine oxide, tert-butyl-bis(3-hydroxypropyl)phosphine oxide or methyl-bis(3-hydroxypropyl)phosphine oxide.

According to a particularly preferred embodiment of the invention the flame retardant composition comprises as component a) isobutyl-bis(hydroxymethyl)phosphine oxide.

Hydroxyalkyl phosphine oxide (I) are known compounds and are described, e.g. in U.S. Pat. No. 5,084,546. Their preparation is described in U.S. Pat. No. 5,084,546. Some compounds are commercially available, e.g. from Cytec Industries Inc., such as Cyagard® RF-1241 (isobutyl-bis-(hydroxymethyl)phosphine oxide) or Cyagard® RF-1243 (isobutyl-bis(3-hydroxypropyl)phosphine oxide).

A particularly preferred embodiment of the invention relates to a composition, which comprises as component a) at least one hydroxyalkyl phosphine oxide (I), Wherein m and n independently of one another represent numerals from 1 to 4; and
R represents $C_1$-$C_4$alkyl, hydroxy-$C_1$-$C_4$alkyl, phenyl, phenyl substituted by 1 to 3 substituents selected from the group consisting of hydroxy, methyl, tert-butyl and methoxy.

A highly preferred embodiment of the invention relates to a composition, which comprises as component a) at least one hydroxyalkyl phosphine oxide (I), Wherein m and n independently of one another represent numerals from 1 to 3; and
R represents $C_1$-$C_4$alkyl or hydroxy-$C_1$-$C_4$alkyl.

A most preferred embodiment of the invention relates to a composition, which comprises as component a) at least one hydroxyalkyl phosphine oxide of the formula (I), Wherein m and n represent 1; and R represents isobutyl.

Component b)

In a polyphosphate salt of a 1,3,5-triazine compound of the formula (II), the 1,3,5-triazine compound is the basic salt component which is selected from a variety of compounds within the scope of that definition, such as melamine, melam, melem, melon, ammeline, ammelide, 2-ureidomelamine, acetoguanamine, benzoguanamine or diamine phenyltriazine.

Melamine polyphosphate and a process for preparing this salt are described, inter alia, in WO 97/44377. According to this reference, melamine polyphosphate having a solubility of 0.01 to 0.10 g per 100 ml water at 25° C., a pH between 2.5 and 4.5, and a melamine/phosphorus molar ratio of between 1.0 and 1.1, may be obtained at 25° C. as an aqueous slurry of 10.0 wt %.

The preparation of a polyphosphate salt of a 1,3,5-triazine compound wherein the number p of the average degree of condensation is between 5 and 200, and the 1,3,5-triazine content amounts to 1.1 to 2.0 mol of a 1,3,5-triazine compound is described in WO 00/02869.

This reference discloses a process which involves the conversion of a 1,3,5-triazine compound with orthophosphoric acid into its orthophosphate salt, followed by dehydration and thermal treatment to convert the orthophosphate salt into a polyphosphate of the 1,3,5-triazine compound.

The p-value of the polyphosphate salts is preferably between 40 and 150, and the ratio of 1,3,5-triazine compound per mol of phosphorus atom is preferably between 1.2 and 1.8. Further, the pH of an aqueous slurry of salts of 10.0 wt %, as prepared according to this method, is greater than 4.5 and preferably at least 5.0. The referenced pH value is determined by introducing the salt and pure water at room temperature into a 300-ml beaker, stirring the resulting aqueous slurry for some 30 minutes, and then measuring the pH.

This thermal treatment is preferably performed at a temperature of at least 300° C., and preferably at least 310° C. In addition to orthophosphates of 1,3,5-triazine compounds, other 1,3,5-triazine phosphates may also be used, including, for example, a mixture of orthophosphates and pyrophosphates.

The orthophosphate of the 1,3,5-triazine compound may be prepared in a variety of other processes. The preferred process involves adding the 1,3,5-triazine compound to an aqueous solution of orthophosphoric acid. An alternative process involves adding orthophosphoric acid to an aqueous slurry of the 1,3,5-triazine compound.

Some polyphosphate salts of a 1,3,5-triazine compound are commercially available, such as melamine polyphosphate (Melapur® 200, Ciba Specialty Chemicals, Basel Switzerland).

A further embodiment of the invention relates to a composition, which comprises as component b)

At least one polyphosphate salt of a 1,3,5-triazine compound of the formula (II), wherein T represents a 1,3,5-triazine compound;

p represents a numeral greater than 3;

And the 1,3,5-triazine content is higher than 1.0 mol 1,3,5-triazine compound per mol of phosphorus atom.

A particularly preferred embodiment of the invention relates to a composition, which comprises as component b)

At least one polyphosphate salt of a 1,3,5-triazine compound of the formula (II), wherein T represents a 1,3,5-triazine compound;

p represents a numeral greater than 5, preferably greater than 10;

And the 1,3,5-triazine content is higher than 1.1 mol 1,3,5-triazine compound per mol of phosphorus atom.

A highly preferred embodiment of the invention relates to a composition, which comprises as component b) at least one polyphosphate salt of melamine.

Component c)

In a polyfunctional epoxide compound at least two epoxy groups of the partial formula

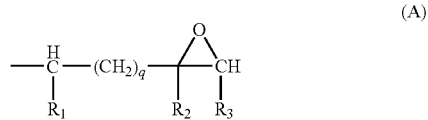

(A)

are present, which are attached directly to carbon, oxygen, nitrogen or sulphur atoms, and wherein q represents zero, $R_1$ and $R_3$ both represent hydrogen and $R_2$ represents hydrogen or methyl; or wherein q represents zero or 1, $R_1$ and $R_3$ together form the —$CH_2$—$CH_2$— or —$CH_2$—$CH_2$—$CH_2$— groups and $R_2$ represents hydrogen.

Examples of polyfunctional epoxide compounds are:

I) Polyglycidyl esters and poly(β-methylglycidyl) esters obtainable by reacting a compound having at least two carboxyl groups in the molecule with epichlorohydrin and/or glyceroldichlorohydrin and/or β-methylepichlorohydrin. The reaction is carried out in the presence of bases.

Suitable compounds having at least two carboxyl groups in the molecule are aliphatic polycarboxylic acids, such as glutaric, adipic, pimelic, suberic, azelaic, sebacic or dimerized or trimerized linoleic acid. Cycloaliphatic polycarboxylic acids are suitable, e.g. tetrahydrophthalic, 4-methyltetrahydrophthalic, hexahydrophthalic or 4-methylhexahydrophthalic acid.

Aromatic polycarboxylic acids are suitable, such as phthalic, isophthalic, trimellitic and pyromellitic acid. Likewise suitable are carboxyl-terminated adducts of, for example, trimellitic acid and polyols such as glycerol or 2,2-bis(4-hydroxycyclohexyl)propane.

II) Polyglycidyl ethers or poly(β-methylglycidyl)ethers obtainable by reacting a compound having at least two free alcoholic hydroxyl groups and/or phenolic hydroxyl groups with a suitably substituted epichlorohydrin under alkaline conditions or in the presence of an acidic catalyst with subsequent treatment under alkaline conditions. Ethers of this type are derived, for example, from straight-chained alcohols, such as ethyleneglycol, diethyleneglycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins.

In the alternative, they are derived, for example, from cycloaliphatic alcohols, such as 1,3- or 1,4-dihydroxycyclohexane, bis(4-hydroxycyclohexyl)methane, 2,2-bis(4-hydroxycyclohexyl)-propane or 1,1-bis(hydroxymethyl)cyclohex-3-ene, or they possess aromatic nuclei, such as N,N-bis(2-hydroxyethyl)aniline or p,p'-bis(2-hydroxyethyl-amino)diphenylmethane.

The epoxy compounds may also be derived from mononuclear phenols, such as resorcinol or hydroquinone; or they are based on polynuclear phenols, such as bis(4-hydroxyphenyl)methane, 2,2-bis(4-hydroxyphenyl) propane, 2,2-bis(3,5-dibromo-4-hydroxyphenyl)-propane or 4,4'-dihydroxydiphenyl sulphone, or on condensates of phenols with formaldehyde that are obtained under acidic conditions, such as phenol Novolak®.

III) Poly(N-glycidyl) compounds obtainable by dehydrochlorinating the reaction products of epichlorohydrin with amines containing at least two amino hydrogen atoms. These amines are, for example, aniline, toluidine, n-butylamine, bis(4-aminophenyl)methane, m-xylylenediamine or bis(4-methylaminophenyl)methane, and also N,N,O-triglycidyl-m-aminophenol or N,N,O-triglycidyl-p-aminophenol.

The poly(N-glycidyl) compounds also include N,N'-diglycidyl derivatives of cycloalkylene-ureas, such as ethylene urea or 1,3-propyleneurea, and N,N'-diglycidyl derivatives of hydantoins, such as of 5,5-dimethylhydantoin.

IV) Poly(S-glycidyl) compounds, such as di-S-glycidyl derivatives derived from dithiols, such as ethane-1,2-dithiol or bis(4-mercaptomethylphenyl)ether.

Epoxy compounds having a radical of the formula A, in which $R_1$ and $R_3$ together are —$CH_2$—$CH_2$— and n is 0 are bis(2,3-epoxycyclopentyl)ether, 2,3-epoxycyclopentyl glycidyl ether or 1,2-bis(2,3-epoxycyclopentyloxy)ethane. An example of an epoxy resin having a radical of the formula A in which $R_1$ and $R_3$ together are —$CH_2$—$CH_2$— and n is 1 is (3,4-epoxy-6-methylcyclohexyl)methyl 3',4'-epoxy-6'-methylcyclohexanecarboxylate.

Polyfunctional epoxide compounds are known. Many of them are commercially available from Huntsman Advanced Materials (brand name Araldite®). Examples of suitable polyfunctional epoxides are:

a) Liquid bisphenol A diglycidyl ethers, such as ARALDITE GY 240, ARALDITE GY 250, ARALDITE GY 260, ARALDITE GY 266, ARALDITE GY 2600, ARALDITE MY 790;

b) Solid bisphenol A diglycidyl ethers such as ARALDITE GT 6071, ARALDITE GT 7071, ARALDITE GT 7072, ARALDITE GT 6063, ARALDITE GT 7203, ARALDITE GT 6064, ARALDITE GT 7304, ARALDITE GT 7004, ARALDITE GT 6084, ARALDITE GT 1999, ARALDITE GT 7077, ARALDITE GT 6097, ARALDITE GT 7097, ARALDITE GT 7008, ARALDITE GT 6099, ARALDITE GT 6608, ARALDITE GT 6609, ARALDITE GT 6610;

c) Liquid bisphenol F diglycidyl ethers, such as ARALDITE GY 281, ARALDITE GY 282, ARALDITE PY 302, ARALDITE PY 306;

d) Solid polyglycidyl ethers of tetraphenylethane, such as CG Epoxy Resin®0163;

e) Solid and liquid polyglycidyl ethers of phenol-formaldehyde Novolak®, such as EPN 1138, EPN 1139, GY 1180, PY 307;

f) Solid and liquid polyglycidyl ethers of o-cresol-formaldehyde NOVOLAK, such as ECN 1235, ECN 1273, ECN 1280, ECN 1299;
g) Liquid glycidyl ethers of alcohols, such as Shell®glycidyl ether 162, ARALDITE DY 0390, ARALDITE DY 0391;
h) Liquid glycidyl ethers of carboxylic acids, such as Shell®Cardura E terephthalic ester, trimellitic ester, ARALDITE PY 284;
i) Solid heterocyclic epoxy resins (triglycidyl isocyanurate), such as ARALDITE PT 810;
k) Liquid cycloaliphatic epoxy resins, such as ARALDITE CY 179;
l) Liquid N,N,O-triglycidyl ethers of p-aminophenol, such as ARALDITE MY 0510;
m) Tetraglycidyl-4,4'-methylenebenzamine or N,N,N',N'-tetraglycidyldiaminophenylmethane, such as ARALDITE MY 720, ARALDITE MY 721.

If desired, a mixture of epoxy compounds of different structure can also be employed.

Suitable polyfunctional epoxide compounds preferably comprise at least two groups of the formula

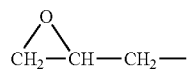

Particular preference as component c) is given to the following compounds of types and/or mixtures of them

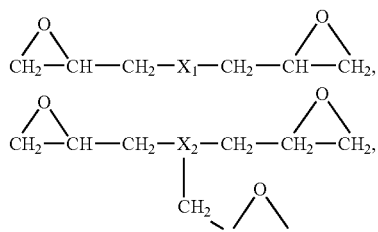

Wherein $X_1$, $X_2$ and $X_3$ are cyclohexylene, phenylene or naphthylene which can be unsubstituted or substituted and $X_1$ is additionally an unsubstituted or substituted radical of the partial formula

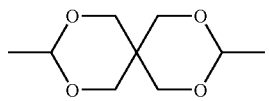

and $X_2$ is additionally an unsubstituted or substituted radical of the partial formula

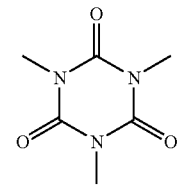

Suitable substituents for the abovementioned radicals are —O—, —S—, —C(=O)—, —C(=O)—O—, —S(=O)=, —S(O$_2$)—, —C(CF$_3$)$_2$—, alkyl, alkylene, aryl, arylene, alkoxy, aryloxy or halogen. Identical or different substituents may be present two or more times, whereas the substituents themselves may likewise be further substituted.

An example of a suitable alkyl radical is a $C_1$-$C_{18}$alkyl radical, such as methyl, ethyl, n-propyl, n-butyl, sec-butyl, tert-butyl, n-hexyl, n-octyl, 2-ethylhexyl, n-nonyl, n-decyl, n-undecyl, n-dodecyl, n-tridecyl, n-tetradecyl, n-hexadecyl or n-octadecyl, and their branched isomers.

Possible alkylene and alkoxy radicals can be derived formally from the above-mentioned alkyl radicals by removing a further hydrogen atom or, respectively, by adding an oxygen atom.

Examples of suitable aryl radicals are those having 6-20 carbon atoms, such as phenylene, biphenylene or naphthylene.

Possible arylene and aryloxy radicals can be derived formally from the abovementioned aryl radicals by removing a further hydrogen atom or, respectively, by adding an oxygen atom.

Preference is given to radicals of the following formulae:

for $X_1$:

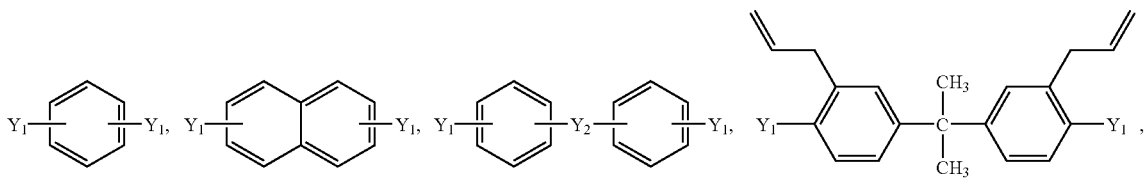

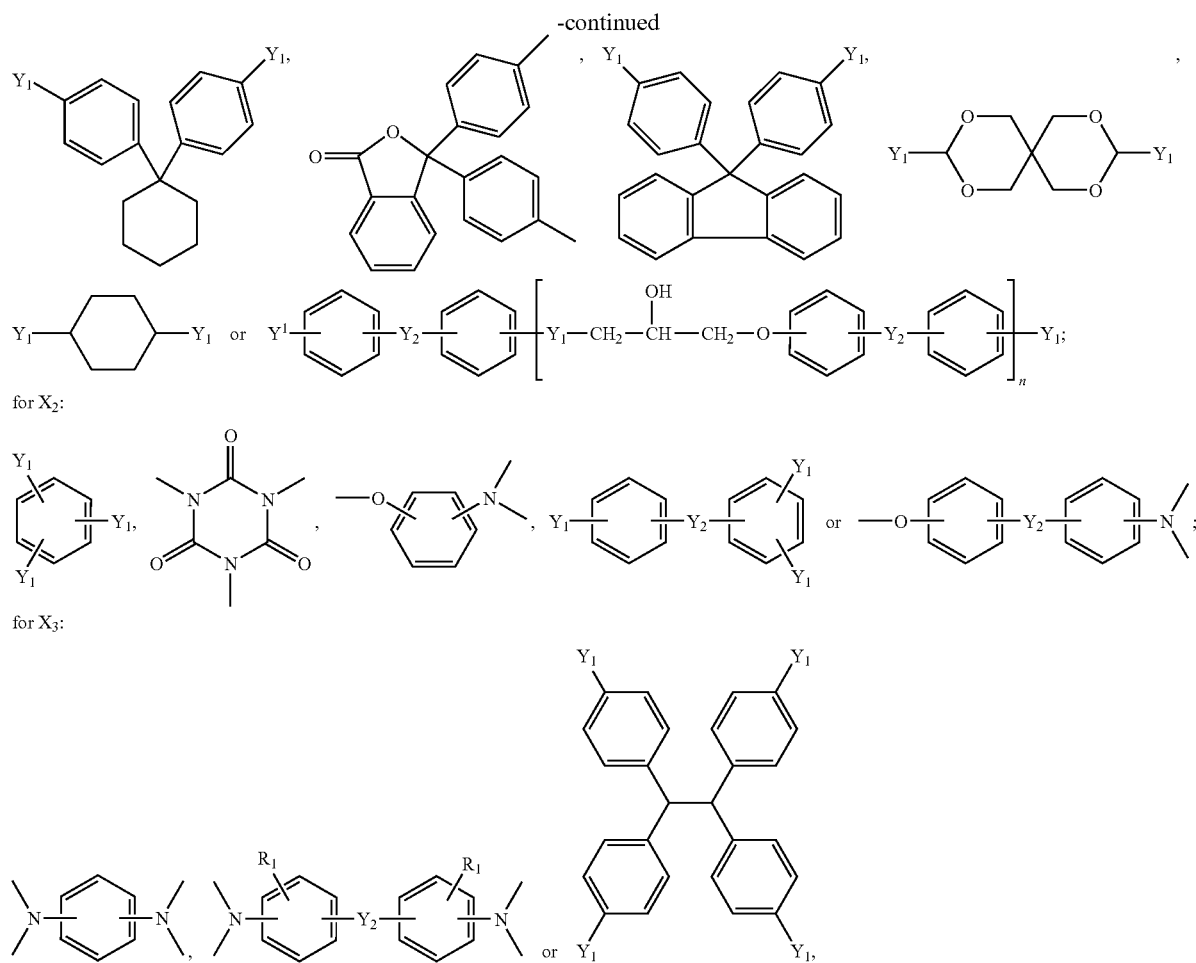
for $X_2$:
for $X_3$:
in which
$Y_1$ is a direct bond or the groups —O—, —S— or —C(=O)O—;
$Y_2$ is a direct bond or the groups —$SO_2$—, —CO—, —S—, —SO—, $CH_2$—, —$C(CH_3)_2$— or —$C(CF_3)_2$—;
And n is 1-10.
The aromatic rings are unsubstituted or substituted one or more times by alkyl, aryl, alkoxy, aryloxy or halogen, as described in more detail above.
Particular preference is given to the following compounds:
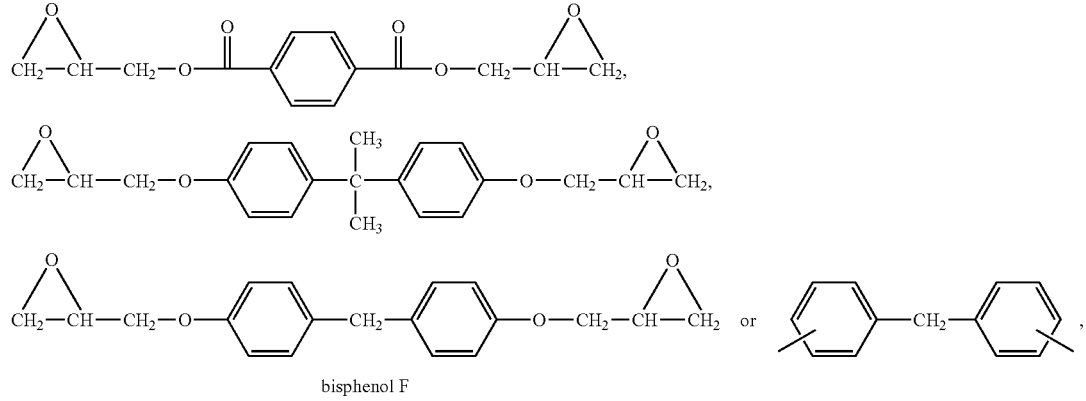
bisphenol F

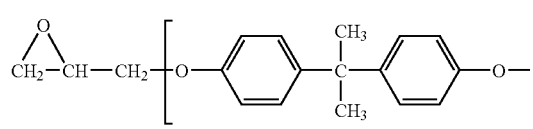
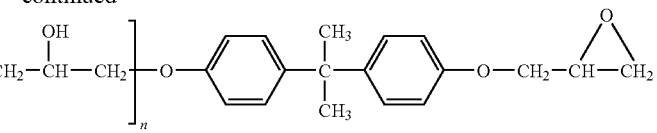

(n = 1-10)

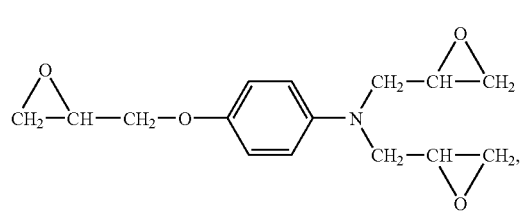
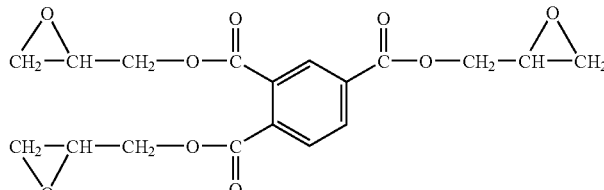

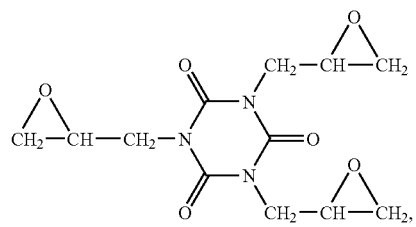
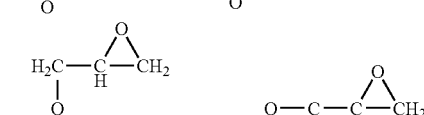
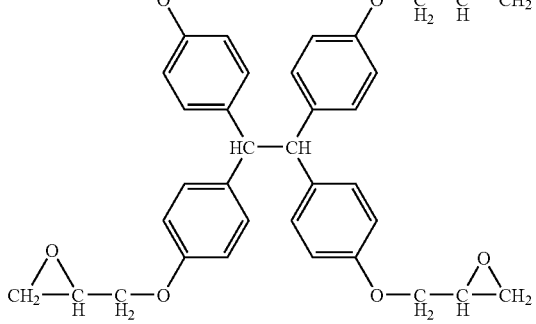

Component $d_1$)

According to a preferred embodiment, a hardener component is present in the composition. Suitable hardener compound is any of the known hardeners for epoxy resins. The amine and anhydride hardeners are particularly preferred, such as polyamines, e.g. ethylenediamine, diethylenetriamine, triethylenetriamine, hexamethylenediamine, methanediamine, N-amino-ethyl piperazine, diaminodiphenylmethane [DDM], isophoronediamine [IPD], diaminodiphenylsulphone [DDS], 4,4'-methylenedianiline [MDA], or m-phenylenediamine [MPDA]), polyamides, alkyl/alkenyl imidazoles, dicyandiamide [DICY] or acid anhydrides, e.g. dodecenylsuccinic acid anhydride, hexahydrophthalic acid anhydride, tetrahydrophthalic acid anhydride, phthalic acid anhydride, pyromellitic acid anhydride), and derivatives thereof.

A preferred embodiment of the invention relates to a composition, which comprises as component $d_1$) a hardener compound that contains at least two amino groups, such as dicyanodiamide.

The invention furthermore relates to a process for the production of an epoxy resin composition having flame retardant properties which comprises mixing at least one polyfunctional epoxide compound c), an effective amount of at least one hydroxyalkyl phosphine oxide (I) and a polyphosphate salt of a 1,3,5-triazine compound (II) and a hardener $d_1$), optionally in the presence of a suitable accelerator, such as methyl imidazole.

The process is carried out in a known manner by analogous methods, such as the ones described in U.S. Pat. No. 5,084,546.

Component $d_2$)

According to an alternative embodiment, components a), b) and c) are present in a polymer substrate. The term polymer substrate comprises within its scope thermoplastic polymers or thermosets. A list of suitable synthetic polymers is given below:

1. Polymers of monoolefins and diolefins, for example polypropylene, polyisobutylene, polybut-1-ene, poly-4-methylpent-1-ene, polyvinylcyclohexane, polyisoprene or polybutadiene, as well as polymers of cycloolefins, for instance of cyclopentene or norbornene, polyethylene (which optionally can be crosslinked), for example high density polyethylene (HDPE), high density and high molecular weight polyethylene (HDPE-HMW), high density and ultrahigh molecular weight polyethylene (HDPE-UHMW), medium density polyethylene (MDPE), low density polyethylene (LDPE), linear low density polyethylene (LLDPE), (VLDPE) and (ULDPE).

Polyolefins, i.e. the polymers of monoolefins exemplified in the preceding paragraph, preferably polyethylene and polypropylene, can be prepared by different and especially by the following methods:

a) Radical polymerisation (normally under high pressure and at elevated temperature).

b) Catalytic polymerisation using a catalyst that normally contains one or more than one metal of groups IVb, Vb, VIb or VIII of the Periodic Table. These metals usually have one or more than one ligand, typically oxides, halides, alcoholates, esters, ethers, amines, alkyls, alkenyls and/or aryls that may be either π- or σ-coordinated. These metal complexes may be in the free form or fixed on substrates, typically on activated magnesium chloride, titanium(III) chloride, alumina or silicon oxide. These catalysts may be soluble or insoluble in the polymerisation medium. The catalysts can be used by themselves in the polymerisation or further activators may be used, typically metal alkyls, metal hydrides, metal alkyl halides, metal alkyl oxides or metal alkyloxanes, said metals being elements of groups Ia, IIa and/or IIIa of the Periodic Table. The activators may be modified conveniently with further ester, ether, and amine or silyl ether groups. These catalyst systems are usually termed Phillips, Standard Oil Indiana, Ziegler-Natta), TNZ (DuPont), metallocene or single site catalysts (SSC).
2. Mixtures of the polymers mentioned under 1), for example mixtures of polypropylene with polyisobutylene, polypropylene with polyethylene (for example PP/HDPE, PP/LDPE) and mixtures of different types of polyethylene (for example LDPE/HDPE).
3. Copolymers of monoolefins and diolefins with each other or with other vinyl monomers, for example ethylene/propylene copolymers, linear low density polyethylene (LLDPE) and mixtures thereof with low density polyethylene (LDPE), propylene/but-1-ene copolymers, propylene/isobutylene copolymers, ethylene/but-1-ene copolymers, ethylene/hexene copolymers, ethylene/methylpentene copolymers, ethylene/heptene copolymers, ethylene/octene copolymers, ethylene/vinylcyclohexane copolymers, ethylene/cycloolefin copolymers (e.g. ethylene/norbornene like COC), ethylene/1-olefins copolymers, where the 1-olefin is generated in-situ; propylene/butadiene copolymers, isobutylene/isoprene copolymers, ethylene/vinylcyclohexene copolymers, ethylene/alkyl acrylate copolymers, ethylene/alkyl methacrylate copolymers, ethylene/vinyl acetate copolymers or ethylene/acrylic acid copolymers and their salts (ionomers) as well as terpolymers of ethylene with propylene and a diene such as hexadiene, dicyclopentadiene or ethylidene-norbornene; and mixtures of such copolymers with one another and with polymers mentioned in 1) above, for example polypropylene/ethylene-propylene copolymers, LDPE/ethylene-vinyl acetate copolymers (EVA), LDPE/ethylene-acrylic acid copolymers (EAA), LLDPE/EVA, LLDPE/EAA and alternating or random polyalkylene/carbon monoxide copolymers and mixtures thereof with other polymers, for example polyamides.
4. Hydrocarbon resins (for example $C_5$-$C_9$) including hydrogenated modifications thereof (e.g. tackifiers) and mixtures of polyalkylenes and starch;
The homopolymers and copolymers mentioned above may have a stereo structure including syndiotactic, isotactic, hemi-isotactic or atactic; where atactic polymers are preferred. Stereo block polymers are also included.
5. Polystyrene, poly(p-methylstyrene), poly(α-methylstyrene).
6. Aromatic homopolymers and copolymers derived from vinyl aromatic monomers including styrene, α-methylstyrene, all isomers of vinyl toluene, especially p-vinyl toluene, all isomers of ethyl styrene, propyl styrene, vinyl biphenyl, vinyl naphthalene, and vinyl anthracene, and mixtures thereof. Homopolymers and copolymers may have a stereo structure including syndiotactic, isotactic, hemi-isotactic or atactic; where atactic polymers are preferred. Stereo block polymers are also included;
 a) Copolymers including aforementioned vinyl aromatic monomers and comonomers selected from ethylene, propylene, dienes, nitriles, acids, maleic anhydrides, maleimides, vinyl acetate and vinyl chloride or acrylic derivatives and mixtures thereof, for example styrene/butadiene, styrene/acrylonitrile, styrene/ethylene (interpolymers), styrene/alkyl methacrylate, styrene/butadiene/alkyl acrylate, styrene/butadiene/alkyl methacrylate, styrene/maleic anhydride, styrene/acrylonitrile/methyl acrylate; mixtures of high impact strength of styrene copolymers and another polymer, for example a polyacrylate, a diene polymer or an ethylene/propylene/diene terpolymer; and block copolymers of styrene such as styrene/butadiene/styrene, styrene/isoprene/styrene, styrene/ethylene/butylene/styrene or styrene/ethylene/propylene/styrene.
 b) Hydrogenated aromatic polymers derived from hydrogenation of polymers mentioned under 6.), especially including polycyclohexylethylene (PCHE) prepared by hydrogenating atactic polystyrene, often referred to as polyvinylcyclohexane (PVCH).
 c) Hydrogenated aromatic polymers derived from hydrogenation of polymers mentioned under 6a). Homopolymers and copolymers may have a stereo structure including syndiotactic, isotactic, hemi-isotactic or atactic; where atactic polymers are preferred. Stereo block polymers are also included.
7. Graft copolymers of vinyl aromatic monomers such as styrene or α-methylstyrene, for example styrene on polybutadiene, styrene on polybutadiene-styrene or polybutadiene-acrylonitrile copolymers; styrene and acrylonitrile (or methacrylonitrile) on polybutadiene; styrene, acrylonitrile and methyl methacrylate on polybutadiene; styrene and maleic anhydride on polybutadiene; styrene, acrylonitrile and maleic anhydride or maleimide on polybutadiene; styrene and maleimide on polybutadiene; styrene and alkyl acrylates or methacrylates on polybutadiene; styrene and acrylonitrile on ethylene/propylene/diene terpolymers; styrene and acrylonitrile on polyalkyl acrylates or polyalkyl methacrylates, styrene and acrylonitrile on acrylate/butadiene copolymers, as well as mixtures thereof with the copolymers listed under 6), for example the copolymer mixtures known as ABS, MBS, ASA or AES polymers.
8. Halogen-containing polymers such as polychloroprene, chlorinated rubbers, chlorinated and brominated copolymer of isobutylene-isoprene (halobutyl rubber), chlorinated or sulphochlorinated polyethylene, copolymers of ethylene and chlorinated ethylene, epichlorohydrin homo- and copolymers, especially polymers of halogen-containing vinyl compounds, for example polyvinyl chloride, polyvinylidene chloride, polyvinyl fluoride, polyvinylidene fluoride, as well as copolymers thereof such as vinyl chloride/vinylidene chloride, vinyl chloride/vinyl acetate or vinylidene chloride/vinyl acetate copolymers.
9. Polymers derived from α,β-unsaturated acids and derivatives thereof such as polyacrylates and polymethacrylates; polymethyl methacrylates, polyacrylamides and polyacrylonitriles, impact-modified with butyl acrylate.
10. Copolymers of the monomers mentioned under 9) with each other or with other unsaturated monomers, for example acrylonitrile/butadiene copolymers, acrylonitrile/alkyl acrylate copolymers, acrylonitrile/alkoxyalkyl acrylate or acrylonitrile/vinyl halide copolymers or acrylonitrile/alkyl methacrylate/butadiene terpolymers.
11. Polymers derived from unsaturated alcohols and amines or the acyl derivatives or acetals thereof, for example polyvinyl alcohol, polyvinyl acetate, polyvinyl stearate, polyvinyl benzoate, polyvinyl maleate, polyvinyl butyral, polyallyl phthalate or polyallyl melamine; as well as their copolymers with olefins mentioned in Section 1 above.
12. Homopolymers and copolymers of cyclic ethers such as polyalkylene glycols, polyethylene oxide, polypropylene oxide or copolymers thereof with bisglycidyl ethers.
13. Polyacetals such as polyoxymethylene and those polyoxymethylenes, which contain ethylene oxide as a comonomer; polyacetals modified with thermoplastic polyurethanes, acrylates or MBS.
14. Polyphenylene oxides and sulphides, and mixtures of polyphenylene oxides with styrene polymers or polyamides.
15. Polyurethanes derived from hydroxyl-terminated polyethers, polyesters or polybutadienes on the one hand and aliphatic or aromatic polyisocyanates on the other, as well as precursors thereof.
16. Polyamides and co-polyamides derived from diamines and dicarboxylic acids and/or from aminocarboxylic acids or the corresponding lactams, for example polyamide 4, polyamide 6, polyamide 6/6, 6/10, 6/9, 6/12, 4/6, 12/12, polyamide 11, polyamide 12, aromatic polyamides starting from m-xylene diamine and adipic acid; polyamides prepared from hexamethylenediamine and isophthalic or/and terephthalic acid and with or without an elastomer as modifier, for example poly-2,4,4,-trimethylhexamethylene terephthalamide or poly-m-phenylene isophthalamide; and also block copolymers of the aforementioned polyamides with polyolefins, olefin copolymers, ionomers or chemically bonded or grafted elastomers; or with polyethers, e.g. with polyethylene glycol, polypropylene glycol or polytetramethylene glycol; as well as polyamides or co-polyamides modified with EPDM or ABS; and polyamides condensed during processing (RIM polyamide systems).
17. Polyureas, polyimides, polyamide imides, polyether imides, polyester imides, polyhydantoins and polybenzimidazoles.
18. Polyesters derived from dicarboxylic acids and diols and/or from hydroxycarboxylic acids or the corresponding lactones, for example polyethylene terephthalate, polybutylene terephthalate, poly-1,4-dimethylolcyclohexane terephthalate, polyalkylene naphthalate (PAN) and polyhydroxybenzoates, as well as block co-polyether esters derived from hydroxyl-terminated polyethers; and also polyesters modified with polycarbonates or MBS.
19. Polyketones.
20. Polysulphones, polyether sulphones and polyether ketones.
21. Blends of the aforementioned polymers (polyblends), for example PP/EPDM, Polyamide/EPDM or ABS, PVC/EVA, PVC/ABS, PVC/MBS, PC/ABS, PBTP/ABS, PC/ASA, PC/PBT, PVC/CPE, PVC/acrylates, POM/thermoplastic PUR, PC/thermoplastic PUR, POM/acrylate, POM/MBS, PPO/HIPS, PPO/PA 6.6 and copolymers, PA/HDPE, PA/PP, PA/PPO, PBT/PC/ABS or PBT/PET/PC.
22. Polycarbonates that correspond to the general formula:

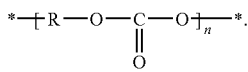

Such polycarbonates are obtainable by interfacial processes or by melt processes (catalytic transesterification). The polycarbonate may be either branched or linear in structure and may include any functional substituents. Polycarbonate copolymers and polycarbonate blends are also within the scope of the invention. The term polycarbonate should be interpreted as inclusive of copolymers and blends with other thermoplastics. Methods for the manufacture of polycarbonates are known, for example, from U.S. Pat. Nos. 3,030,331; 3,169,121; 4,130,458; 4,263,201; 4,286,083; 4,552,704; 5,210,268; and 5,606,007. A combination of two or more polycarbonates of different molecular weights may be used.

Preferred are polycarbonates obtainable by reaction of a diphenol, such as bisphenol A, with a carbonate source. Examples of suitable diphenols are:

Bisphenol A:

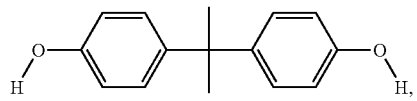

bisphenol AF:

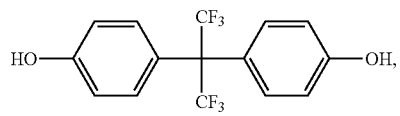

bisphenol AP:

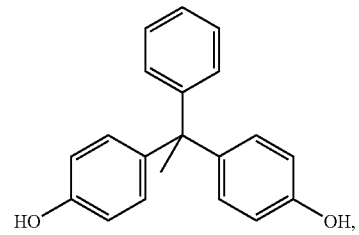

bisphenol B:

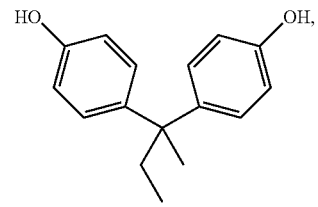

bisphenol C:

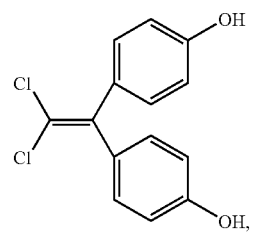

bisphenol E:

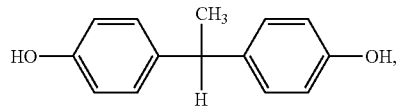

bisphenol F:

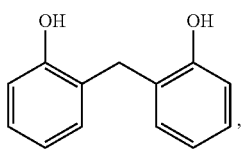

bisphenol M:

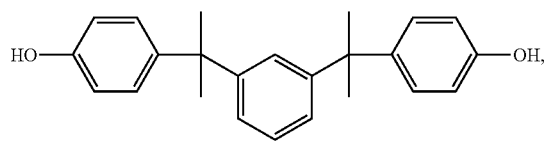

bisphenol P:

bisphenol S:

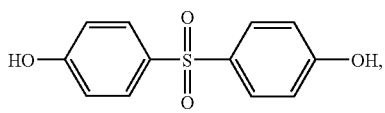

bisphenol TMC:

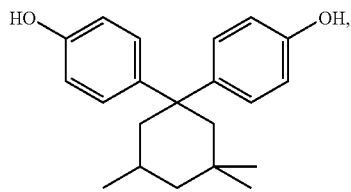

bisphenol Z:

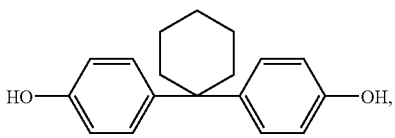

4,4'-(2-norbornylidene)bis(2,6-dichlorophenol); or fluorene-9-bisphenol:

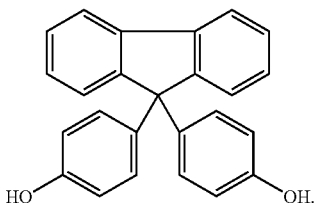

The carbonate source may be a carbonyl halide, a carbonate ester or a haloformate. Suitable carbonate halides are phosgene or carbonylbromide. Suitable carbonate esters are dialkylcarbonates, such as dimethyl- or diethylcarbonate, diphenyl carbonate, phenyl-alkylphenylcarbonate, such as phenyl-tolylcarbonate, dialkylcarbonates, such as dimethyl- or diethylcarbonate, di-(halophenyl)carbonates, such as di-(chlorophenyl)carbonate, di-(bromophenyl)carbonate, di-(trichlorophenyl)carbonate or di-(trichlorophenyl)carbonate, di-(alkylphenyl)carbonates, such as di-tolylcarbonate, naphthylcarbonate, dichloronaphthylcarbonate and others.

The polymer substrate mentioned above, which comprises polycarbonates or polycarbonate blends, is a polycarbonate-copolymer, wherein isophthalate/terephthalate-resorcinol segments are present. Such polycarbonates are commercially available, e.g. Lexan® SLX (General Electrics Co. USA). Other polymeric substrates of component b) may additionally contain in the form as admixtures or as copolymers a wide variety of synthetic polymers including polyolefins, polystyrenes, polyesters, polyethers, polyamides, poly(meth)acrylates, thermoplastic polyurethanes, polysulphones, polyacetals and PVC, including suitable compatibilizing agents. For example, the polymer substrate may additionally contain thermoplastic polymers selected from the group of resins consisting of polyolefins, thermoplastic polyurethanes, styrene polymers and copolymers thereof. Specific embodiments include polypropylene (PP), polyethylene (PE), polyamide (PA), polybutylene terephthalate (PBT), polyethylene terephthalate (PET), glycol-modified polycyclohexylenemethylene terephthalate (PCTG), polysulphone (PSU), polymethylmethacrylate (PMMA), thermoplastic polyurethane (TPU), acrylonitrile-butadiene-styrene (ABS), acrylonitrile-styrene-acrylic ester (ASA), acrylonitrile-ethylene-propylene-styrene (AES), styrene-maleic anhydride (SMA) or high impact polystyrene (HIPS).

Additional Components

The instant invention further pertains to a composition, which comprises, in addition to the components a), b), c) and $d_1$) or a), b), c) and $d_2$), as defined above, further additives selected from the group consisting of so-called anti-dripping agents, polymer stabilizers and additional flame-retardants, such as phosphorus containing flame-retardants, nitrogen containing flame-retardants, halogenated flame-retardants and inorganic flame-retardants.

According to a preferred embodiment the invention relates to a composition, which additionally comprises further additives selected from the group consisting of polymer stabilizers and additional flame retardants.

According to another embodiment, the invention relates to a composition which additionally comprises as additional component so-called anti-dripping agents.

These anti-dripping agents reduce the melt flow of the thermoplastic polymer and inhibit the formation of drops at high temperatures. Various references, such as U.S. Pat. No. 4,263,201, describe the addition of anti-dripping agents to flame retardant compositions.

Suitable additives that inhibit the formation of drops at high temperatures include glass fibers, polytetrafluoroethylene (PTFE), high temperature elastomers, carbon fibers, glass spheres and the like.

The addition of polysiloxanes of different structures has been proposed in various references; cf. U.S. Pat. Nos. 6,660,787, 6,727,302 or 6,730,720.

Stabilizers are preferably halogen-free and selected from nitroxyl stabilizers, nitrone stabilizers, amine oxide stabilizers, benzofuranone stabilizers, phosphite and phosphonite stabilizers, quinone methide stabilizers and monoacrylate esters of 2,2'-alkylidenebisphenol stabilizers.

According to a preferred embodiment of the invention, the composition comprises an additional flame retardant component. Such additional flame-retardants are known components, items of commerce or can be obtained by known methods.

According to a preferred embodiment, the composition comprises as an additional flame retardant component the metal salt of hypophosphinic acid, as represented by the formula

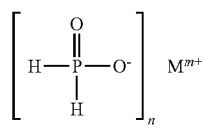

in which
M represents $(C_1-C_4\text{alkyl})_4N$, $(C_1-C_4\text{alkyl})_3NH$, $(C_2-C_4\text{alkylOH})_4N$, $(C_2-C_4\text{alkylOH})_3NH$, $(C_2-C_4\text{alkylOH})_2N(CH_3)_2$, $(C_2-C_4\text{alkylOH})_2NHCH_3$, $(C_6H_5)_4N$, $(C_6H_5)_3NH$, $(C_6H_5CH_3)_4N$, $(C_6H_5CH_3)_3NH$, $NH_4$, an alkali metal or earth alkali metal ion, or an aluminium, zinc, iron or boron ion;
m is a numeral from 1-3 and indicates the number of positive charges on M; and
n is a numeral from 1-3 and indicates the number of phosphinic acid anions corresponding to $M^{m+}$.

A highly preferred embodiment relates to a composition, which comprises as additional flame retardant component the aluminium salt of hypophosphinic acid.

Other representative phosphorus containing flame-retardants, in addition to the ones defined above with regard to components a) and b), are for example:
Tetraphenyl resorcinol diphosphite (Fyrolflex® RDP, Akzo Nobel), tetrakis(hydroxymethyl)phosphonium sulphide, triphenyl phosphate, diethyl-N,N-bis(2-hydroxyethyl)-amino-methyl phosphonate, hydroxyalkyl esters of phosphorus acids, ammonium polyphosphate (APP) or (Hostaflam® AP750), resorcinol diphosphate oligomer (RDP), phosphazene flame-retardants and ethylenediamine diphosphate (EDAP).

Nitrogen containing flame-retardants are, for example, isocyanurate flame-retardants, such as polyisocyanurate, esters of isocyanuric acid or isocyanurates. Representative examples are hydroxyalkyl isocyanurates, such as tris-(2-hydroxyethyl)isocyanurate, tris(hydroxymethyl)isocyanurate, tris(3-hydroxy-n-proyl)isocyanurate or triglycidyl isocyanurate.

Nitrogen containing flame-retardants include further melamine-based flame-retardants. Representative examples are: melamine cyanurate, melamine borate, melamine phosphate, melamine pyrophosphate, melamine ammonium polyphosphate, melamine ammonium pyrophosphate, dimelamine phosphate, melamine pyrophosphate.

Further examples are: benzoguanamine, tris(hydroxyethyl)isocyanurate, allantoin, glycoluril, melamine cyanurate, melamine phosphate, dimelamine phosphate, melamine pyrophosphate, urea cyanurate, ammonium polyphosphate, a condensation product of melamine from the series melem, melam, melon and/or a higher condensed compound or a reaction product of melamine with phosphoric acid or a mixture thereof.

Representative organohalogen flame-retardants are, for example:
Polybrominated diphenyl oxide (DE-60F, Great Lakes Corp.), decabromodiphenyl oxide (DBDPO; Saytex® 102E), tris[3-bromo-2,2-bis(bromomethyl)propyl]phosphate (PB 370®, FMC Corp.), tris(2,3-dibromopropyl)phosphate, tris (2,3-dichloropropyl)phosphate, chlorendic acid, tetrachlorophthalic acid, tetrabromophthalic acid, poly-β-chloroethyl triphosphonate mixture, tetrabromobisphenol A bis(2,3-dibromopropyl ether) (PE68), brominated epoxy resin, ethylene-bis(tetrabromophthalimide) (Saytex® BT-93), bis (hexachlorocyclopentadieno)cyclooctane (Declorane Plus®), chlorinated paraffins, octabromodiphenyl ether, hexachlorocyclopentadiene derivatives, 1,2-bis(tribromophenoxy)ethane (FF680), tetrabromo-bisphenol A (Saytex® RB100), ethylene bis-(dibromo-norbornanedicarboximide) (Saytex® BN-451), bis-(hexachlorocycloentadeno) cyclooctane, PTFE, tris-(2,3-dibromopropyl)-isocyanurate, and ethylene-bis-tetrabromophthalimide.

The flame-retardant mentioned above routinely combined with an inorganic oxide synergist. Most common for this use are zinc or antimony oxides, e.g. $Sb_2O_3$ or $Sb_2O_5$. Boron compounds are suitable, too.

The above-mentioned additional flame-retardant classes are advantageously contained in the composition of the invention in an amount from about 0.5% to about 45.0% by weight of the organic polymer substrate; for instance about 1.0% to about 40.0%; for example about 5.0% to about 35.0% by weight of the polymer or based on the total weight of the composition.

As mentioned above, the composition according to the invention may additionally contain one or more conventional additives, for example selected from pigments, dyes, plasticizers, antioxidants, thixotropic agents, levelling assistants, basic co-stabilizers, metal passivators, metal oxides, organophosphorus compounds, further light stabilizers and mixtures thereof, especially pigments, phenolic antioxidants, calcium stearate, zinc stearate, UV absorbers of the 2-hydroxy-benzophenone, 2-(2'-hydroxyphenyl)benzotriazole and/or 2-(2-hydroxyphenyl)-1,3,5-triazine groups.

The incorporation of the components defined above into the polymer component is carried out by known methods such as dry blending in the form of a powder, or wet mixing in the form of solutions, dispersions or suspensions for example in an inert solvent, water or oil. The additive components a), b) and c) and optional further additives may be incorporated, for example, before or after molding or also by applying the dissolved or dispersed additive or additive mixture to the polymer material, with or without subsequent evaporation of the solvent or the suspension/dispersion agent. They may be added directly into the processing apparatus (e.g. extruders, internal mixers, etc.), e.g. as a dry mixture or powder, or as a solution or dispersion or suspension or melt.

The addition of the additive components to the polymer substrate $d_2$) can be carried out in customary mixing machines in which the polymer is melted and mixed with the additives. Suitable machines are known to those skilled in the art. They are predominantly mixers, kneaders and extruders.

The process is preferably carried out in an extruder by introducing the additive during processing.

Particularly preferred processing machines are single-screw extruders, contra-rotating and co-rotating twin-screw extruders, planetary-gear extruders, ring extruders or co-kneaders. It is also possible to use processing machines provided with at least one gas removal compartment to which a vacuum can be applied.

Suitable extruders and kneaders are described, for example, in *Handbuch der Kunststoffextrusion, Vol. 1 Grundlagen*, Editors F. Hensen, W. Knappe, H. Potente, 1989, pp. 3-7, ISBN:3-446-14339-4 (*Vol. 2 Extrusionsanlagen* 1986, ISBN 3-446-14329-7).

For example, the screw length is 1-60 screw diameters, preferably 35-48 screw diameters. The rotational speed of the screw is preferably 10-600 rotations per minute (rpm), preferably 25-300 rpm.

The maximum throughput is dependent on the screw diameter, the rotational speed and the driving force. The process of the present invention can also be carried out at a level lower than maximum throughput by varying the parameters mentioned or employing weighing machines delivering dosage amounts.

If a plurality of components is added, these can be premixed or added individually.

The additive components a), b) and c) and optional further additives can also be sprayed onto the polymer substrate $d_2$). The additive mixture dilutes other additives, for example the conventional additives indicated above, or their melts so that they can be sprayed also together with these additives onto the polymer substrate. Addition by spraying during the deactivation of the polymerisation catalysts is particularly advantageous; in this case, the steam evolved may be used for deactivation of the catalyst. In the case of spherically polymerised polyolefins it may, for example, be advantageous to apply the additives of the invention, optionally together with other additives, by spraying.

The additive components a), b) and c) and optional further additives can also be added to the polymer in the form of a master batch ('concentrate") which contains the components in a concentration of, for example, about 1.0% to about 40.0% and preferably 2.0% to about 20.0% by weight incorporated in a polymer. The polymer is not necessarily of identical structure than the polymer where the additives are added finally. In such operations, the polymer can be used in the form of powder, granules, solutions, and suspensions or in the form of lattices.

Incorporation can take place prior to or during the shaping operation. The materials containing the additives of the invention described herein preferably are used for the production of molded articles, for example roto-molded articles, injection molded articles, profiles and the like, and especially a fiber, spun melt non-woven, film or foam.

A further embodiment of the invention relates to a flame retardant mixture which comprises
a) At least one hydroxyalkyl phosphine oxide (I),
  Wherein m and n independently of one another represent numerals from 1 to 8; and
  R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy; and
b) At least one polyphosphate salt of a 1,3,5-triazine compound (II),
  Wherein T represents a 1,3,5-triazine compound; and
  p represents a numeral greater than 3.

A particularly preferred embodiment relates to a mixture, which comprises
a) At least one hydroxyalkyl phosphine oxide (I),
  Wherein m and n independently of one another represent numerals from 1 to 8; and
  R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;
b) At least one polyphosphate salt of a 1,3,5-triazine compound (II),
  Wherein T represents a 1,3,5-triazine compound; and
  p represents a numeral greater than 3; and
c) At least one polyfunctional epoxide compound.

The components a) and b) are admixed to the polyfunctional epoxide compound c) in concentrations of 0.05-30.0 wt. %, preferably 0.1-20.0 wt. % for component a) and 0.5-40.0 wt. %, preferably 1.0-25 wt. % for component b).

The preferred ratio of components a):b) is in the range 10:1-1:10, preferably 5:1-1:5.

A further embodiment of the invention relates to a process for imparting flame retardancy to a hardened polyfunctional epoxide composition, which process comprises adding the above-defined flame retardant mixture comprising components a) and b) and a hardener compound to the polyfunctional epoxide c).

A further embodiment of the invention relates to a process for imparting flame retardancy to a polymer substrate, which process comprises adding the mixture comprising components a), b) and c) to the polymer substrate.

The following examples illustrate the invention but are not meant to limit the scope thereof in any manner:

Components

Bisphenol A type epoxy resin: Araldite® GT 6071, Huntsman Advanced Materials, Basel, Switzerland;
Hardener: Dicyanodiamide (DICY), accelerator: methylimidazole, both from Aldrich, Germany;
Solvent: Methoxy-2-propanol, Merck Eurolab, Germany;
Isobutyl-bis(hydroxymethyl)phosphine oxide: Cyagard® RF-1241, Cytec Technology Corp., Netherlands;
Isobutyl-bis(hydroxypropyl)phosphine oxide: Cyagard® RF-1243, Cytec;
Melamine polyphosphate: Melapur® 200, Ciba Specialty Chemicals, Switzerland;
Glass cloth: Type 7628, P-D Intergals Technologies AG, Germany.

Test Methods to Assess Flame Retardancy

UL 94 test is performed according to the general rules described in "Flammability of Plastic Materials for Parts in Devices and Appliances", 5th edition, Oct. 29, 1996.

Standard Procedure (1)

A resin formulation is prepared using different amounts of Araldite® GT 6071 resin. 4.6 parts of DICY, 0.3 parts of methylimidazole accelerator and 60 parts methoxy-2-propanol are added to the resin composition, followed by the above-mentioned isobutyl-bis(hydroxyalkyl)phosphine oxide flame retardants.

After complete mixing of the above mixture in a glass jar at 70° C. and continuous stirring for a period of 30 min, the second flame retardant component, melamine polyphosphate is added and mixed thoroughly with the above mentioned mixture until a homogeneous composition is obtained.

The composition is then coated onto a piece of glass cloth and heated to 170° C. for about 3-5 min in a forced draft oven. It should be noted that the time and the forced draft oven was varied slightly sample to sample in order to control resin flow of the final laminate. The fiber material, now in the shape of a non-tacky prepreg, is cut into eight strips (~180×180 mm) which are stacked upon each other in a distance holder, to assure the manufacture of laminates with uniform thicknesses of 1.6 mm. The strips are covered with two Teflon® plates of 1 mm thickness on the upper and the lower side of the prepreg stack. The stack is placed on a hot press, and the stacked prepregs are subjected to elevated temperature and pressure according to the following general schedule:

30 minutes at 120° C. with no pressure applied,
90 minutes at 170° C. with pressure of about 3 bar applied.

The resulting laminate is then removed from the press, cooled to ambient temperature, and separated from the distance holder and TEFLON plates. The laminate is cut into pieces of ~150×150 mm by cutting off the edges with varying amounts of resin, weighed, its thickness measured, and its percent resin content determined. Thereafter, the laminate is cut into five strips (125×13.0 mm) which are conditioned for 24 h at 25° C. and 50% relative humidity and subsequently tested in the previously mentioned UL-94 flammability test. The data obtained in this test are presented in Table 1.

TABLE 1

Referential Compositions

| Composition | FR Additives [wt. %] | Resin [%] | UL94 Rating [1.6 mm] | Total Burning time [sec] |
|---|---|---|---|---|
| 1 | w/o | 37.2 | n.c. | 490 |
| 2 | 22.5% Tetrabromobisphenol A (13.2% Br) | 40.9 | V-0 | 29 |
| 3 | 25.0% Tetrabromobisphenol A (14.7% Br) | 39.4 | V-0 | 28 |
| 4 | 30.6% Tetrabromobisphenol A (18% Br) | 42.1 | V-0 | 19 |
| 5 | 20.0% Melamine polyphosphate MELAPUR 200 | 40.3 | n.c.*) | 420 |
| 6 | 22.5% Melamine polyphosphate | 39.7 | n.c.*) | 327 |
| 7 | 25.0% Melamine polyphosphate | 46.2 | n.c.*) | 360 |
| 8 | 30.0% Melamine polyphosphate | 43.7 | n.c. | 190 |
| 9 | 15.0% Isobutyl-bis(hydroxy-methyl)phosphine oxide CYAGARD RF-1241 | 35.9 | V-1 | 81 |
| 10 | 15.0% Isobutyl-bis(hydroxy-propyl) phosphine oxide CYAGARD RF-1243 | 36.0 | V-1 | 110 |
| 11 | 17.5% Isobutyl-bis(hydroxy-methyl) phosphine oxide | 35.6 | Delamination | |
| 12 | 17.5% Isobutyl-bis(hydroxy-propyl)phosphine oxide | 37.0 | V-1 | 107 |
| 13 | 20.0% Isobutyl-bis(hydroxy-methyl) phosphine oxide | 33.63 | Delamination | |
| 14 | 20.0% Isobutyl-bis(hydroxy-propyl) phosphine oxide | — | Delamination | |
| 15 | 25% Al-hypophosphite | 42.3 | n.c. | 140 |
| 16 | 12.5% Melamine polyphosphate 12.5% Al-hypophosphite | 41.2 | n.c. | 156 |
| 17 | 10.0% Isobutyl-bis(hydroxy-methyl) phosphine oxide 15.0% Al-hypophosphite | | Delamination | |

*)Burns to clamp

TABLE 2

Inventive Compositions

| Composition | FR Additives [wt. %] | Resin [%] | UL94 Rating [1.6 mm] | Total burning time [sec] |
|---|---|---|---|---|
| Example 1 | 10.0% Isobutyl-bis(hydroxy-methyl) phosphine oxide + 10.0% Melamine polyphosphate | 41.2 | V-1 | 69 |
| Example 2 | 10.0% Isobutyl-bis(hydroxy-methyl) phosphine oxide + 12.5% Melamine polyphosphate | 42.2 | V-1 | 49 |
| Example 3 | 7.5% Isobutyl-bis(hydroxy-methyl) phosphine oxide + 15.0% Melamine polyphosphate | 40.2 | V-0 | 24 |
| Example 4 | 10.0% Isobutyl-bis(hydroxy-methyl) phosphine oxide + 15.0% melamine polyphosphate | 41.2 | V-0 | 13 |
| Example 5 | 12.5% Isobutyl-bis(hydroxy-methyl) phosphine oxide + 12.5% Melamine polyphosphate | 36.2 | V-0 | 15 |
| Example 6 | 10.0% Isobutyl-bis(hydroxy-propyl) phosphine oxide + 15.0% Melamine polyphosphate | 39.5 | V-1 | 108 |
| Example 7 | 10.0% Isobutyl-bis(hydroxy-propyl) phosphine oxide + 20.0% Melamine polyphosphate | 41.4 | V-0 | 27 |

TABLE 2-continued

Inventive Compositions

| Composition | FR Additives [wt. %] | Resin [%] | UL94 Rating [1.6 mm] | Total burning time [sec] |
|---|---|---|---|---|
| Example 8 | 10.0% Isobutyl-bis(hydroxy-methyl) phosphine oxide 10.0% Melamine polyphosphate 5.0% Al-hypophosphite | 42.5 | V-0 | 8 |
| Example 9 | 5.0% Isobutyl-bis(hydroxy-methyl) phosphine oxide 15.0% Melamine polyphosphate 5.0% Al-hypophosphite | 48.3 | V-0 | 13 |

The data presented in Table 1 demonstrate that the resin compositions of the invention exhibit improved flame retardant properties as compared with resin compositions containing only one of the mentioned flame retardant components alone and compared with TBBA (=tetrabromobisphenol A) at the same total loading level. Furthermore, the inventive flame retardant resin compositions show a strongly reduced tendency to undergo delamination as compared with laminates containing only the hydroxyalkyl phosphine oxide component in the above mentioned compositions.

Standard Procedure (2)

A resin formulation is prepared using different amounts of Araldite® GT 6071 resin. 9.2 parts of DICY, 0.3 parts of methylimidazole accelerator and 60 parts methoxy-2-propanol are added to the resin composition, followed by the above-mentioned isobutyl-bis(hydroxymethyl)phosphine oxide flame retardant.

After complete mixing the above mixture in a glass jar at 70° C. and continuous stirring for a period of 30 min, the other flame retardant components, melamine polyphosphate and aluminium hypophosphite are added and mixed thoroughly with the above mentioned mixture until a homogeneous composition is obtained.

The composition is then coated onto a piece of glass cloth and heated to 170° C. for about 2-4 min in a forced draft oven. It should be noted that the time and the forced draft oven was varied slightly sample to sample in order to control resin flow of the final laminate. The fiber material, now in the shape of a non-tacky prepreg, is cut into eight strips (~180×180 mm) which are stacked upon each other in a distance holder, to assure the manufacture of laminates with uniform thicknesses of 1.6 mm. The strips are covered with two Teflon® plates of 1 mm thickness on the upper and the lower side of the prepreg stack. The stack is placed on a hot press, and the stacked prepregs are subjected to elevated temperature and pressure according to the following general schedule:

1 minute at 170° C. with no pressure applied, 120 minutes at 170° C. with pressure of about 3 bar applied.

The resulting laminate is removed from the press, cooled to ambient temperature, and separated from the distance holder and TEFLON plates. The laminate is cut into pieces of ~150×150 mm by cutting off the edges with varying amounts of resin, weighed, its thickness measured, and its percent resin content determined. Thereafter, the laminate is cut into five strips (125×13.0 mm) which are conditioned for 24 h at 25° C. and 50% relative humidity and subsequently tested in the previously mentioned UL-94 flammability test. The data obtained in this test are presented in Tables 3 and 4:

TABLE 3

Referential Compositions

| Composition | FR Additives [wt. %] | Resin [%] | UL94 Rating [1.6 mm] | Total Burning time [sec] |
|---|---|---|---|---|
| 18 | w/o | 37.2 | n.c. | 215 |
| 19 | 20.0% Tetrabromobisphenol | 48.1 | V-0 | 17 |
| 20 | 20.0% Melamine polyphosphate | 37.4 | n.c. | 189 |
| 21 | 10.0% Melamine polyphosphate 10.0% Al-hypophosphite | 36.9 | V-1 | 70 |

TABLE 4

Inventive Compositions

| Composition | FR Additives [wt. %] | Resin [%] | UL94 Rating [1.6 mm] | Total burning time [sec] |
|---|---|---|---|---|
| Example 10 | 7.5% Isobutyl-bis(hydroxymethyl) phosphine oxide 7.5%% Melamine polyphosphate 5.0% Al-hypophosphite | 42.0 | V-0 | 24 |

The addition of Al hypophosphite as the third flame retardant component significantly improves the flame retardant properties as compared with referential resin compositions containing melamine polyphosphate alone or in combination with Al-hypophosphite or with TBBA alone at the same total loading level.

The invention claimed is:

1. A composition, which comprises
a) at least one hydroxyalkyl phosphine oxide of the formula

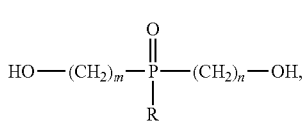

(I)

wherein m and n independently of one another represent numerals from 1 to 8; and
R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;
b) at least one polyphosphate salt of a 1,3,5-triazine compound of the formula

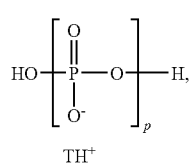

(II)

wherein T represents a 1,3,5-triazine compound; and
p represents a numeral greater than 3;
c) at least one polyfunctional epoxide compound; and at least one selected from the group consisting of
$d_1$) a hardener compound and
$d_2$) a polymer substrate.

2. A composition according to claim 1, which comprises
a) at least one hydroxyalkyl phosphine oxide of the formula (I),
wherein m and n independently of one another represent numerals from 1 to 8; and
R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;
b) at least one polyphosphate salt of a 1,3,5-triazine compound of the formula (II),
wherein T represents a 1,3,5-triazine compound; and
p represents a numeral greater than 3;
c) at least one polyfunctional epoxide compound; and
$d_1$) a hardener compound.

3. A composition according to claim 1, which comprises
a) at least one hydroxyalkyl phosphine oxide of the formula (I),
wherein m and n independently of one another represent numerals from 1 to 8; and
R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;
b) at least one polyphosphate salt of a 1,3,5-triazine compound of the formula (II),
wherein T represents a 1,3,5-triazine compound; and
p represents a numeral greater than 3;
c) at least one polyfunctional epoxide compound; and
$d_2$) a polymer substrate.

4. A composition according to claim 1, which comprises as component a) at least one hydroxyalkyl phosphine oxide of the formula (I),
wherein m and n independently of one another represent numerals from 1 to 4; and
R represents $C_1$-$C_4$alkyl, hydroxy-$C_1$-$C_4$alkyl, phenyl, phenyl substituted by 1 to 3 substituents selected from the group consisting of hydroxy, methyl, tert-butyl and methoxy.

5. A composition according to claim 1, which comprises as component a) at least one hydroxyalkyl phosphine oxide of the formula (I),
wherein m and n independently of one another represent numerals from 1 to 3; and
R represents $C_1$-$C_4$alkyl or hydroxy-$C_1$-$C_4$alkyl.

6. A composition according to claim 1, which comprises as component a) at least one hydroxyalkyl phosphine oxide of the formula (I),
wherein m and n represent 1; and
R represents isobutyl.

7. A composition according to claim 1, which comprises as component b) at least one polyphosphate salt of a 1,3,5-triazine compound of the formula (II), wherein
T represents a 1,3,5-triazine compound;
p represents a numeral greater than 3;
and the 1,3,5-triazine content is higher than 1.0 mol 1,3,5-triazine compound per mol of phosphorus atom.

8. A composition according to claim 1, which comprises as component b) at least one polyphosphate salt of a 1,3,5-triazine compound of the formula (II), wherein
T represents a 1,3,5-triazine compound;
p represents a numeral greater than 5, preferably greater than 10;
and the 1,3,5-triazine content is higher than 1.1 mol 1,3,5-triazine compound per mol of phosphorus atom.

9. A composition according to claim 8, which comprises as component b) at least one polyphosphate salt of melamine.

10. A composition according to claim 1, which comprises as component c) at least one polyfunctional epoxide compound, wherein at least two epoxy groups of the partial formula

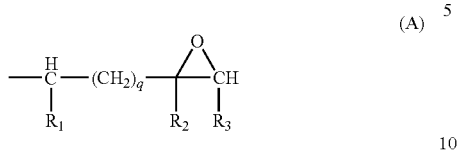
(A)

are present, which are attached directly to carbon, oxygen, nitrogen or sulphur atoms, and wherein q represents zero, $R_1$ and $R_3$ both represent hydrogen and $R_2$ represents hydrogen or methyl; or wherein q represents zero or 1, $R_1$ and $R_3$ together form the —$CH_2$—$CH_2$— or —$CH_2$—$CH_2$—$CH_2$— groups and $R_2$ represents hydrogen.

11. A composition according to claim 1, which comprises as component $d_1$) a hardener compound that contains at least two amino groups.

12. A composition according to claim 1, which additionally comprises one or more further additives selected from the group consisting of polymer stabilizers and additional flame retardants.

13. A mixture which comprises
a) at least one hydroxyalkyl phosphine oxide of formula (I),

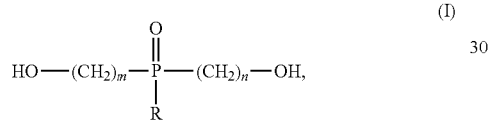
(I)

wherein m and n independently of one another represent numerals from 1 to 8; and R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy; and b) at least one polyphosphate salt of a 1,3,5-triazine compound of formula (II),

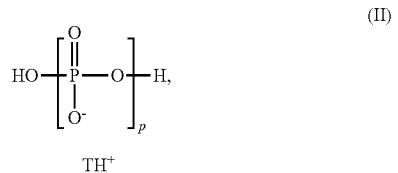
(II)

wherein T represents a 1,3,5-triazine compound; and
p represents a numeral greater than 3.

14. A mixture, which comprises
a) at least one hydroxyalkyl phosphine oxide of formula (I),

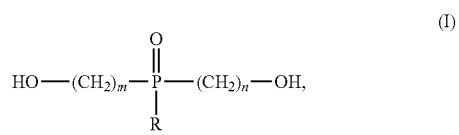
(I)

wherein m and n independently of one another represent numerals from 1 to 8; and R represents $C_1$-$C_8$alkyl, hydroxy-$C_1$-$C_8$alkyl, phenyl, phenyl substituted by 1 to 3 substituents selected from the group consisting of hydroxy, $C_1$-$C_4$alkyl and $C_1$-$C_4$alkoxy;

b) at least one polyphosphate salt of a 1,3,5-triazine compound of formula (II),

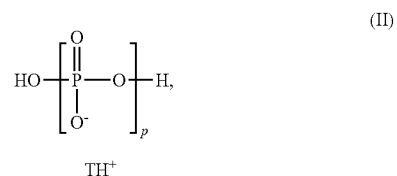
(II)

wherein T represents a 1,3,5-triazine compound; and p represents a numeral greater than 3; and c) at least one polyfunctional epoxide compound.

15. A process for imparting flame retardancy to a hardened polyfunctional epoxide composition, which process comprises adding the mixture according to claim 13 and a hardener compound to a polyfunctional epoxide compound.

16. A process for imparting flame retardancy to a polymer substrate, which process comprises adding to a polymer substrate the mixture according to claim 14.

17. The composition according to claim 1, wherein R in formula (I) is a $C_1$-$C_8$alkyl group.

* * * * *